United States Patent [19]
Sandhu

[11] Application Number: 6,083,568
[45] Publication Date: *Jul. 4, 2000

[54] METHOD OF REDUCING CARBON INCORPORATION INTO FILMS PRODUCED BY CHEMICAL VAPOR DEPOSITION INVOLVING ORGANIC PRECURSOR COMPOUNDS

[75] Inventor: Gurtej S. Sandhu, Boise, Id.

[73] Assignee: Micron Technology, Inc., Boise, Id.

[ * ] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 08/823,020

[22] Filed: Mar. 21, 1997

Related U.S. Application Data

[63] Continuation of application No. 08/506,040, Jul. 24, 1995, Pat. No. 5,661,115, which is a continuation-in-part of application No. 08/336,260, Nov. 8, 1994, Pat. No. 5,576,071.

[51] Int. Cl.[7] .............................. C23C 16/56; H05H 1/00
[52] U.S. Cl. ......................... 427/534; 427/535; 427/533; 427/255.7
[58] Field of Search ..................... 427/534, 533, 427/535, 255.1, 255.2, 255.7; 134/1.1

[56] References Cited

U.S. PATENT DOCUMENTS

| | | | |
|---|---|---|---|
| 4,558,509 | 12/1985 | Tiwari | 29/576 B |
| 4,568,565 | 2/1986 | Gupta et al. | 427/53.1 |
| 4,926,237 | 5/1990 | Sun et al. | |
| 5,130,172 | 7/1992 | Hicks et al. | 427/252 |
| 5,139,825 | 8/1992 | Gordon et al. | 427/255.2 |
| 5,232,871 | 8/1993 | Ho | 437/190 |
| 5,300,321 | 4/1994 | Nakano et al. | 427/248.1 |
| 5,320,878 | 6/1994 | Maya | 427/573 |
| 5,399,379 | 3/1995 | Sandhu | 427/255 |
| 5,403,620 | 4/1995 | Kaesz et al. | 427/252 |
| 5,567,483 | 10/1996 | Foster et al. | 427/535 |
| 5,607,722 | 3/1997 | Vaartstra et al. | 4271/248.1 |

FOREIGN PATENT DOCUMENTS

| | | |
|---|---|---|
| 2-19468 | 1/1990 | Japan . |
| 5-234953 | 9/1993 | Japan . |

OTHER PUBLICATIONS

Watanabe et al., "Stacked Capacitor Cells for High–Density Dynamic RAM's", IED 1998, pp. 600–603, no month data!.

Morihara et al., "Disk–Shaped Stacked Capacitor Cell For 256 Mb Dynamic Random–Access Memory", Aug. 19, 1994, Jpn. J. Appl. Phys. vol. 33 (1994), Pt. 1, No. 8, pp. 14–19.

Woo et al., "Selective Etching Technology of in–situ P Doped Poly–Si (SEDOP) for High Density DRAM Capacitors", 1994 Symposium on VLSI Technology of Technical Papers, pp. 25–26, no month !.

Conrad, J.R. et al., "Ion Beam Assisted Coating and Surface Modification With Plasma Source Ion Implantation", J. Vac. Sci. Technol. A 8 (4) Jul/Aug. 1990, 3146–3151.

Niemer, Burkhard et al., "Organometallic Chemical Vapor Deposition of Tungsten Metal, and Suppression of Carbon Incorporation by Codeposition of Platinum", University of California Dept. of Chemistry and Biochemistry, May, 1992, no page number!.

A. Intemann and H. Koerner; F. Koch; "Film Properties of CVD Titanium Nitride Deposited with Organometallic Precursors at Low Pressure Using Inert Gases, Ammonia, or Remote Activation", Jun., 1993.

A. Weber, R. Nikulski, and C.P. Klages; "Position of TiN using tetrakis (dimethylamido)–titanium in electron–cyclotron–resonance plasma process", Jul. 19, 1993, American Institute of Physics, pp. 325–327.

*Primary Examiner*—Roy V. King
*Attorney, Agent, or Firm*—Wells, St. John, Roberts, Gregory & Matkin, P.S.

[57] ABSTRACT

In one aspect, a deposition method comprises the following steps: a) forming a layer on a semiconductive substrate, the layer comprising predominately an inorganic material, the layer also comprising incorporated carbon; b) generating a plasma adjacent the layer from a component gas, the component gas comprising Ar, and c) utilizing the plasma to remove the carbon from the layer.

2 Claims, 1 Drawing Sheet

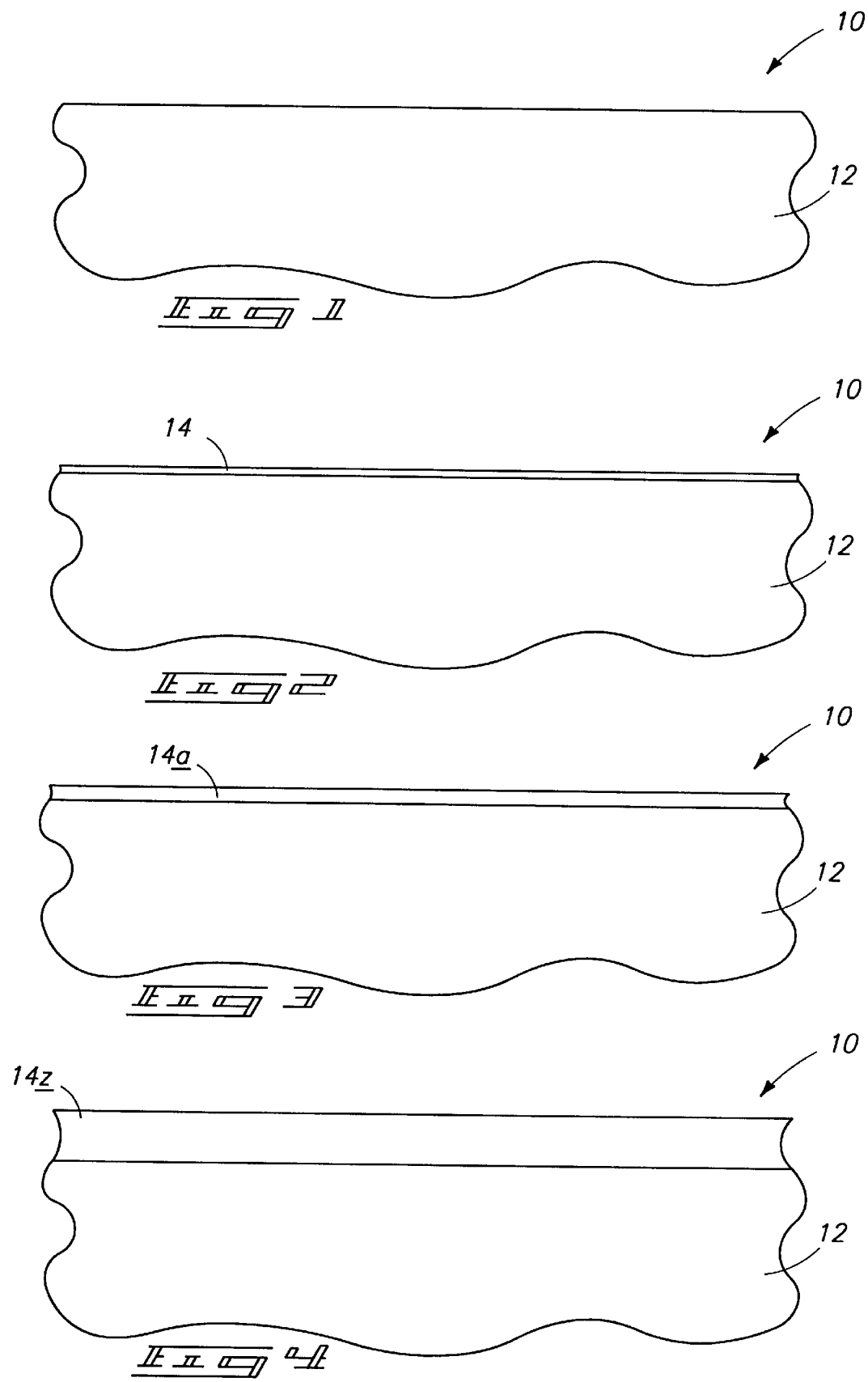

METHOD OF REDUCING CARBON INCORPORATION INTO FILMS PRODUCED BY CHEMICAL VAPOR DEPOSITION INVOLVING ORGANIC PRECURSOR COMPOUNDS

RELATED PATENT DATA

This patent resulted from a continuation application of U.S. application Ser. No. 08/506,040, filed on Jul. 24, 1995, now U.S. Pat. No. 5,661,115, entitled "Method Of Reducing Carbon Incorporation Into Films Produced By Chemical Vapor Deposition Involving Organic Precursor Compounds" listing the inventor as Gurtej S. Sandhu, which resulted from a continuation-in-part application of U.S. patent application Ser. No. 08/336,260 filed on Nov. 8, 1994, now U.S. Pat. No. 5,576,071, entitled, "Method Of Reducing Carbon Incorporation Into Films Produced By Chemical Vapor Deposition Involving Organic Precursor Compounds", listing Gurtej S. Sandhu as the inventor.

TECHNICAL FIELD

This invention relates to methods of reducing carbon incorporation into films produced by chemical vapor deposition involving organometallic precursor compounds.

BACKGROUND OF THE INVENTION

Chemical vapor deposition (CVD) is defined as the formation of a non-volatile solid film on a substrate by the reaction of vapor phase reactants that contain desired components. The gases are introduced into a reactor vessel, and decompose and react at a heated surface on the wafer to form the desired film. Chemical vapor deposition is but one process of providing thin films on semiconductor wafers, such as films of elemental metals or compounds. It is a favored deposition process in many respects, principally because of its ability to provide highly conformal layers even within deep contacts and other openings.

Organic compounds are commonly utilized as chemical vapor deposition precursors. One subclass of this group which is finding increasing use in chemical vapor deposition of metals and metal compounds are organometallic precursors. Specifically, an example is the reaction of a titanium organometallic precursor of the formula $Ti(N(CH_3)_2)_4$, named tetrakisdimethyl-amidotitanium (TDMAT), and ammonia in the presence of a carrier gas which reacts to produce TiN according to the following formula:

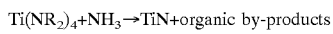

$Ti(NR_2)_4 + NH_3 \rightarrow TiN + $ organic by-products

Organometallic compounds contain a central or linking atom or ion (Ti in TDMAT) combined by coordinate bonds with a definite number of surrounding ligands, groups or molecules, at least one of which is organic (the $(N(CH_3)_2$ groups in TDMAT). The central or linking atom as accepted within the art may not be a "metal" in the literal sense. As accepted within the art of organometallic compounds, the linking atom could be anything other than halogens, the noble gases, H, C, N, O, P, S, Se, and Te.

The above and other chemical vapor deposition reactions involving organometallics are typically conducted at low pressures of less than 1 Torr. It is typically desirable in low pressure chemical vapor deposition processes to operate at as low a pressure as possible to assure complete evacuation of potentially undesirable reactive and contaminating components from the chamber. Even small amounts of these materials can result in a significant undesired increase in film resistivity. For example, oxygen incorporation into the film before and after deposition results in higher resistivity. Additionally, it is believed that organic incorporation (specifically pure carbon or hydrocarbon incorporation) into the resultant film reduces density and resistivity. Such organic incorporation can result from carbon radicals from the organic portion of the precursor becoming incorporated into the film, as opposed to being expelled with the carrier gas. Carbon incorporation can also cause other undesired attributes in the deposited film, such as low density which causes oxygen incorporation into the film when exposed to ambient air.

Hydrogen is a known capable reactant with deposited carbon or metal carbides. Such will react with carbon atoms to form volatile hydrocarbons. Hydrogen atoms, radicals or ions are more reactive than molecular hydrogen in producing volatile hydrocarbons.

It would be desirable to improve upon these and other prior art chemical vapor deposition processes in producing layers having minimal incorporated carbon.

BRIEF DESCRIPTION OF THE DRAWINGS

Preferred embodiments of the invention are described below with reference to the accompanying drawings, which are briefly described below.

FIG. 1 is a diagrammatic sectional view of a semiconductor wafer at one processing step in accordance with the invention.

FIG. 2 is a view of the FIG. 1 wafer at a processing step subsequent to that shown by FIG. 1.

FIG. 3 is a view of the FIG. 1 wafer shown at a processing step subsequent to that shown by FIG. 2.

FIG. 4 is a view of the FIG. 1 wafer shown at a processing step subsequent to that shown by FIG. 3.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a chemical vapor deposition method of providing a layer of material atop a semiconductor wafer using an organic precursor comprises the following steps:

positioning a wafer within a chemical vapor deposition reactor;

injecting an organic precursor to within the reactor having the wafer positioned therein, and maintaining the reactor at a temperature and a pressure which in combination are effective to deposit a first layer of material onto the wafer which incorporates carbon from the organic precursor; and after depositing the first layer, ceasing to inject the organic precursor into the reactor and injecting a component gas into the reactor and generating a plasma from the component gas within the reactor against the first layer, the component gas and plasma generated therefrom having a component which is effective when in an activated state to interact with a component of the deposited first layer to remove carbon from the first layer and produce gaseous products which are expelled from the reactor.

In accordance with another aspect of the invention, a chemical vapor deposition method of providing a layer of material atop a semiconductor wafer using an organic precursor comprises the following steps:

positioning a wafer within a chemical vapor deposition reactor;

injecting an organic precursor to within the reactor having the wafer positioned therein, and maintaining the reactor at a temperature and a pressure which in combination are effective to deposit a first layer of material onto the wafer which incorporates carbon from the organic precursor in the form of a carbide; and after depositing the first layer, ceasing to inject the organic precursor into the reactor and injecting a component gas into the reactor and generating a plasma from the component gas within the reactor against the first layer, the component gas and plasma generated therefrom having a component which is effective when in an activated state to chemically react with a component of the deposited first layer, the activated state component effectively diffusing into the first layer to remove carbon of the carbide from the first layer and produce gaseous products which are expelled from the reactor, the component gas providing a bonding component which replaces and substitutes for the carbon displaced from the carbide in the first layer.

In another aspect, the depositions and plasma treatments are repeated to deposit multiple layers.

More particularly and with reference to the figures, a semiconductor wafer is indicated generally by reference numeral 10, and comprises a bulk substrate 12. Such would be positioned within a chemical vapor deposition reactor for processing in accordance with the invention. An organic precursor and typically a carrier gas would be injected to within the reactor, and the reactor maintained at temperature and pressure conditions which, in combination, are effective to deposit a thin first layer 14 (FIG. 2) of material onto the wafer. Undesirably, carbon from the organic precursor will be incorporated into the deposited first layer.

As an example where the deposited layer is desired to be TiN, one type of precursor would be organometallic precursors such as TDMAT. An example component and carrier gas would be $N_2$. For titanium nitride, the preferred pressure is from 0.1 Torr to 10 Torr. The preferred temperature is 200° C. to 700° C. A specific reduction to practice example temperature and pressure were a wafer carrier temperature of 420° C., and a reactor pressure at 0.5 Torr. Titanium from the organometallic precursor is intended to combine with the nitrogen to deposit a TiN layer. Undesirably, some of the carbon from the organic precursor combines with the titanium to form TiC, as opposed to the desired TiN. While the resultant film will still predominantly comprise TiN, 20 molar percent or greater TiC can be formed within the film. Further and even more undesirable, hydrocarbon products from the precursor typically become incorporated in the film, further adversely affecting conductivity. Example thickness for layer 14 is from a single atomic thick layer to 40 Angstroms, with about 15 Angstroms being preferred. Alternately, thicker layers such as 100 Angstroms or greater might be utilized.

After depositing first layer 14, injection of the organic precursor is ceased, and a first injection of a component gas into the reactor is conducted. Preferably, a time lag is provided between the ceasing of injection of the organic precursor and the injection of the component gas, with an example and preferred time lag period being 5 seconds. Within the reactor, a first plasma is generated from the component gas against first layer 14. Advantageously, the substrate can be biased with a negative voltage (i.e., −100 Volts) during the plasma treatment to attract ions against the substrate. An example reduction-to-practice plasma density of $10^8$ to $10^9$ ions/cm$^3$ was utilized. High density plasma (i.e., $10^{12}$ to $10^{13}$ ions/cm$^3$) may also be employed to obtain a higher density of ions at lower process pressures. Such will facilitate ion bombardment as well as removal of carbon-containing reaction byproducts from the surface of the film.

In accordance with the parent patent application disclosure, the component gas had to at least comprise hydrogen atoms and interact by chemical interaction. In accordance with this continuation-in-part disclosure, the component gas does not necessarily comprise hydrogen atoms and does not require chemical interaction in the literal sense. Yet, the component gas need contain some component which is effective when in an activated state to interact with a component of deposited first layer 14. In one preferred embodiment, this activated state component effectively diffuses into the first layer and interacts with the deposited first layer component to remove carbon from the first layer and produce gaseous products which are expelled from the reactor. Carbon incorporation in the resultant film is thus minimized. Also, the first layer component might comprise unbonded and incomplete electron shell carbon atoms. The activated state component in this example would chemically react with the unbonded and incomplete electron shell atoms to drive carbon from the film.

By way of example, the component gas might consist essentially of $N_2$. If the deposited film comprises undesired TiC (and also perhaps hydrocarbons) where the desired composition is TiN, the nitrogen plasma presents a component (atomic or ionic nitrogen) against the deposited film. This component is chemically reactive with a component of the deposited film (carbon) to remove or displace carbon from such film, and produce gaseous products (i.e., CN compounds) which are expelled from the reactor. The goal or intent with this example is to provide a gas which has some chemically reactive component which breaks a bond within the deposited film to cause carbon (in any of atomic, radical, or molecular radical form) to be displaced from the film and out of the reactor. The component from the gas might remain in the deposited film, combine with the displaced carbon and exit the reactor, or singularly exit the reactor without combining with carbon or other material of the deposited film. Also in this example, $H_2$ might be combined with the $N_2$ gas.

In the above nitrogen example, atomic N functions as a non-metallic bonding component to the metallic Ti, and results in conductive TiN. As another alternative, the component gas might consist essentially of hydrogen, or a combination of two or more reactive components. $NH_3$ is an example of a single component and chemically reactive gas which can present multiple components (N atoms and H atoms) which are separately reactive with components of the example TiN deposited films. Some of the N atoms would become incorporated into the film in place of the displaced carbon, while the H atoms would most likely combine with the displaced carbon to form stabilized hydrocarbons which are predominately expelled from the reactor. An example RF power range for plasma treatment is from 50 to 1,000 W.

As an alternate example, the component gas might consist essentially of elemental Ar. The interaction for carbon removal in this and the above examples may be chemical, physical or a combination of both. The plasma argon ions would bombard the deposited film and react or impinge upon unbonded and incomplete electron shell carbon atoms to effectively drive carbon from the film. Carbon remaining deeper within the film would then outwardly diffuse to be impinged upon by more argon plasma, and be displaced from the film.

Other examples include CVD of $Al_2O_3$ whereby the component gas would preferably include $O_2$. Where the material being deposited is elemental metal, the preferred component gas preferably includes $H_2$.

Also, the deposition to produce layer 14 could be conducted with or without plasma enhancement, while the reactive ion bombardment of the first reactive treatment will always involve plasma in accordance with this invention.

After the first plasma treatment, the organic precursor is again injected to within the reactor which is again maintained at a temperature and pressure which in combination are effective to deposit a subsequent second layer atop layer 14. Again, the outer layer will incorporate carbon from the organic precursor, and in the described example typically in the form of a carbide and hydrocarbons. FIG. 3 illustrates layer 14 having grown to be twice its thickness as layer 14a, with the outer portion of layer 14a constituting the second deposited layer. Carbon will be largely concentrated in this outer region, having been previously removed from the underlying layer 14.

After deposition of this second layer, injection of the organic precursor is ceased, and a second injecting of a component gas is conducted. A second plasma from the component gas within the reactor is generated to cause plasma ions to bombard against the second layer. The second plasma will effectively will present a component which interacts with carbon of the carbide in the second layer, as well as entrained hydrocarbons, to produce gaseous products which diffuse outwardly of the second layer and are expelled from the reactor. Such second plasma treatment is preferably essentially identical to the first, and conducted at a considerably greater time than the time period for the deposition of the second layer. Further preferably, a time lag is provided between ceasing of the injection of the organic precursor and injection of the component gas, with an example preferred time period being 5 seconds.

Referring to FIG. 4, the alternating deposition and treatment sequences are continued until a desired thickness layer 14z is produced. Accordingly, deposition is preferably pulsed with intervening plasma treatment. Typically and most preferably, the sum of the plasma treatment steps time periods will be at least two times the sum of the organic precursor injection steps time periods to facilitate carbon removal from the desired deposited layer. Time for plasma treatments will be impacted by density and permeability of ions from the plasma into the deposited films.

The invention also contemplates single layer deposition with one or more plasma treatments thereof, as well as products produced by the above processes.

In compliance with the statute, the invention has been described in language more or less specific as to structural and methodical features. It is to be understood, however, that the invention is not limited to the specific features described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A chemical vapor deposition method comprising the following steps:

forming a first layer on a semiconductor wafer in a reactor from an organic precursor, the first layer comprising predominately an inorganic material, the first layer also comprising incorporated carbon in the form of a carbide; and after forming the first layer, injecting a component gas into the reactor and generating a plasma from the component gas within the reactor, the component gas comprising Ar and providing an activated component which is effective to remove the carbon of the carbide from the first layer.

2. A chemical vapor deposition method comprising the following steps:

forming a first layer on a semiconductor wafer by injecting an organic precursor into a reactor, the first layer comprising predominately an inorganic material, the first layer also comprising incorporated carbon in the form of a carbide;

after forming the first layer, ceasing to inject the organic precursor into the reactor and first injecting a component gas into the reactor and generating a first plasma from the component gas within the reactor, the component gas comprising Ar and providing an activated component which is effective to remove the carbon of the carbide from the first layer, the component gas providing a bonding component which replaces and substitutes for the carbon displaced from the carbide in the first layer;

after the first plasma treatment, injecting the organic precursor to within the reactor having the wafer positioned therein, and maintaining the reactor at a temperature and a pressure which in combination are effective to form a second layer on the wafer, the second layer comprising carbon in the form of a carbide; and after forming the second layer, ceasing to inject the organic precursor into the reactor and second injecting the component gas into the reactor and generating a second plasma from the component gas within the reactor, the component gas providing an activated component which is effective to remove the carbon of the carbide from the second layer.

* * * * *